(12) United States Patent
Vasudevan

(10) Patent No.: US 7,859,936 B1
(45) Date of Patent: Dec. 28, 2010

(54) METHOD AND APPARATUS FOR SAVING AND RESTORING THE STATE OF A POWER-GATED MEMORY DEVICE

(75) Inventor: Narasimhan Vasudevan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 165 days.

(21) Appl. No.: 12/359,996

(22) Filed: Jan. 26, 2009

(51) Int. Cl.
*G11C 5/14* (2006.01)
(52) U.S. Cl. ............ 365/227; 365/189.17; 365/189.08; 365/154; 365/189.05; 365/230.08
(58) Field of Classification Search ................. 365/227, 365/189.17, 189.08, 154, 189.95, 230.08, 365/191
See application file for complete search history.

(56) References Cited

U.S. PATENT DOCUMENTS 5,917,771 A * 6/1999 Hill ....................... 365/230.03
6,240,040 B1 * 5/2001 Akaogi et al. ........... 365/230.06
6,597,620 B1 * 7/2003 McMinn ................. 365/189.09

* cited by examiner

*Primary Examiner*—Thong Q Le
(74) *Attorney, Agent, or Firm*—Murray Smith

(57) ABSTRACT

A method and apparatus involving a circuit is disclosed. The circuit has separate first and second portions, where the first portion includes a first memory device such as a flip-flop, and the second portion includes a second memory device such as a latch. The first portion is selectively operated in first and second operational modes, the first portion consuming less power in the second operational mode than in the first operational mode. During the first operational mode a logical value is maintained in the flip-flop and can vary dynamically. During the second operational mode, the state that the logical value had at a point in time just before the first portion entered the second operational mode is maintained in the latch. Then, after the first portion switches from the second operational mode back to the first operational mode, the state of the logical value in the latch is restored to the flip-flop.

20 Claims, 4 Drawing Sheets

METHOD AND APPARATUS FOR SAVING AND RESTORING THE STATE OF A POWER-GATED MEMORY DEVICE

FIELD OF THE INVENTION

The invention relates to integrated circuit devices (ICs). More particularly, the invention relates to power-gated circuitry in an IC.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Minimizing power consumption and thus heat dissipation in integrated circuits, such as PLDs, has become increasingly important, in particular for applications that are battery powered. Designers are continuously looking for ways to reduce power consumption and heat dissipation in their integrated circuit designs. One approach for reducing power consumption and heat dissipation is to turn off power to a portion of the integrated circuit when the portion does not need to be operable. This practice is sometimes referred to as "power gating" the portion of the circuit. However, this approach often has the undesirable consequence of causing loss of information that is maintained by the portion of the integrated circuit. For example, a designer may want to power gate a flip-flop in a PLD so that power to the flip-flop can be turned off during a time when the flip-flop does not need to be operable, thereby reducing power consumption and heat dissipation of the PLD. However, when power to the flip-flop is shut off, the logical state of the flip-flop output is lost. Consequently, upon restoring power to the flip-flop, the state of the flip-flop output will be unknown.

SUMMARY

One embodiment of the present invention pertains to a circuit that includes first and second portions. The first portion has first and second operational modes, the first portion including a flip-flop and consuming less power in the second operational mode than in the first operational mode, the flip-flop containing during the first operational mode a logical value that can vary dynamically. The second portion is separate from and coupled to the first portion and includes a latch, wherein during the second operational mode of the first portion the second portion maintains in the latch the state that the logical value had at a point in time just before the first portion entered the second operational mode. The second portion restores the state of the logical value from the latch to the flip-flop after the first portion switches from the second operational mode back to the first operational mode.

Another embodiment of the present invention pertains to a method of operating a circuit having separate first and second portions, where the first portion includes a flip-flop and the second portion includes a latch. The method includes: selectively operating the first portion in first and second operational modes, the first portion consuming less power in the second operational mode than in the first operational mode; maintaining in the flip-flop during the first operational mode a logical value that can vary dynamically; maintaining in the latch during the second operational mode the state that the logical value had at a point in time just before the first portion entered the second operational mode; and restoring the state of the logical value from the latch to the flip-flop after the first portion switches from the second operational mode back to the first operational mode.

Yet another embodiment of the present invention pertains to a circuit that includes a first memory device having first and second power modes where the first memory device consumes less power in the second power mode than in the first power mode. The first memory device stores a state of a logical value during the first power mode. A second memory device, which is coupled to the first memory device, maintains the state that the logical value had at a point in time just before the first memory device entered the second power mode. The second memory device transfers the state of the logical value from the second memory device to the first memory device after the first memory device switches from the second power mode back to the first power mode.

DETAILED DESCRIPTION

Figure 1:
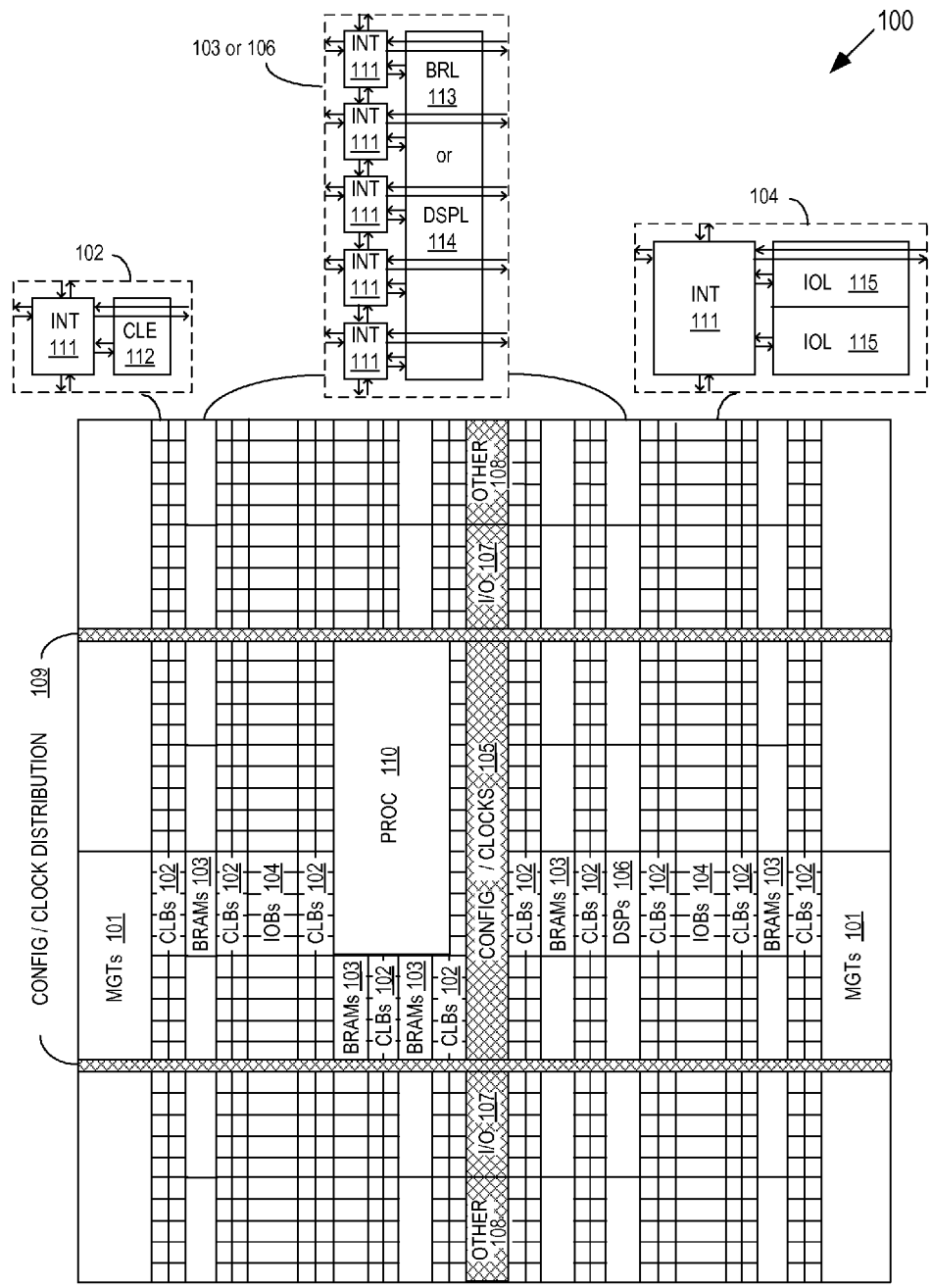
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
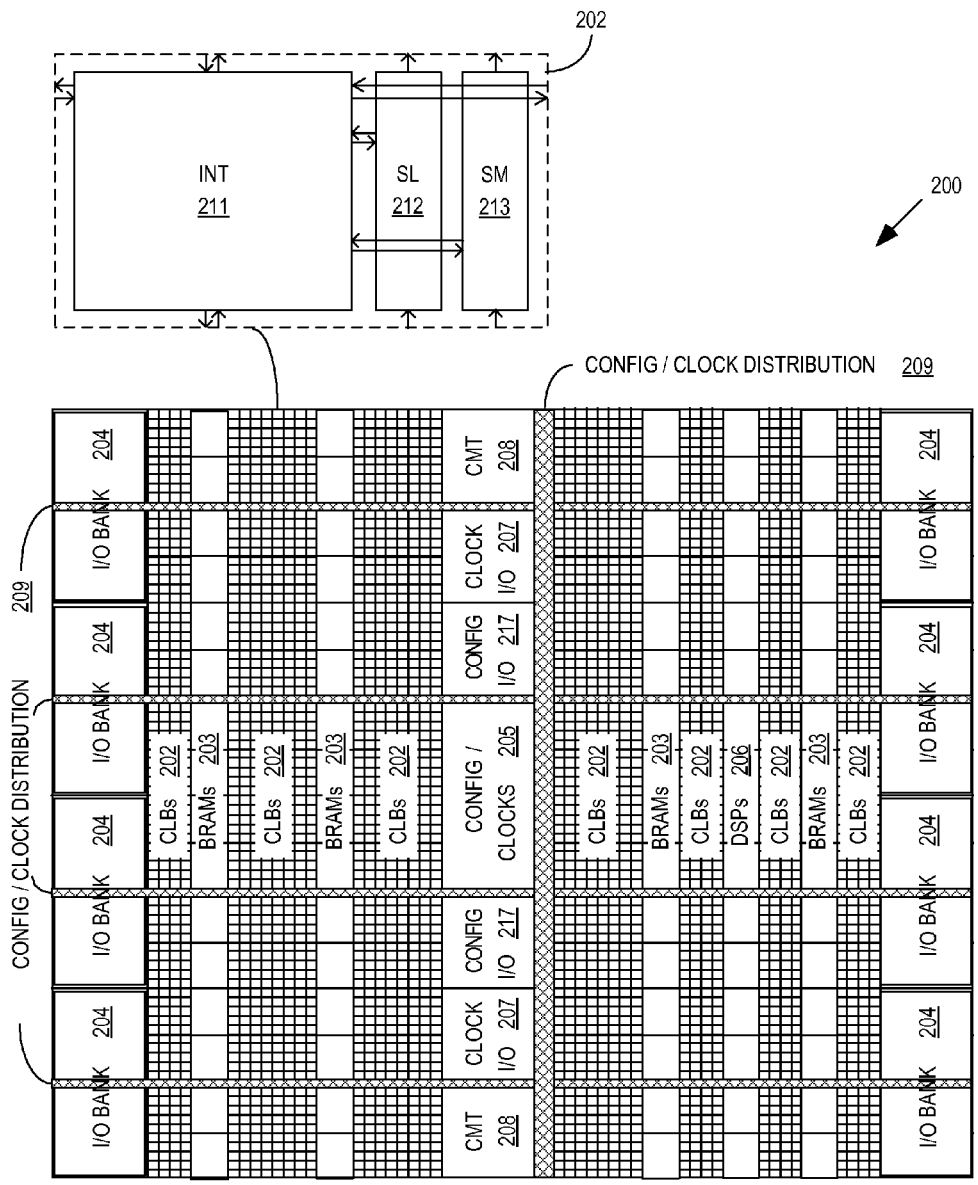
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
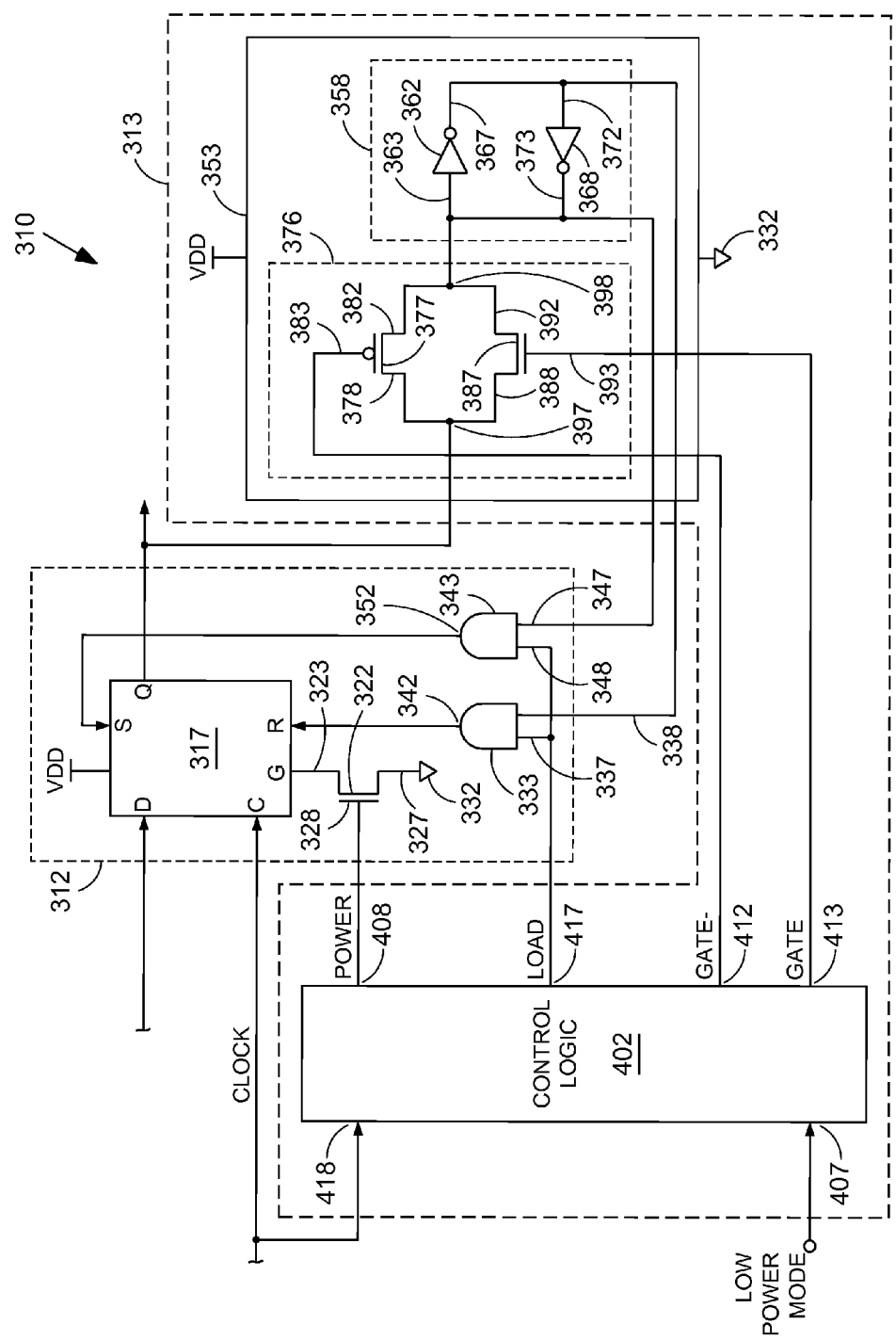
FIG. 3 is a circuit schematic showing a circuit according to an embodiment of the present invention.

FIG. 3 is a circuit schematic showing a circuit 310 according to an embodiment of the present invention. The circuit 310 has a portion 312 and a portion 313. The portion 312 has a memory device such as, e.g., a rising edge-triggered asynchronous reset D flip-flop 317 that is a well known component in the art. Since the D flip-flop 317 is well known in the art, it is discussed here only briefly, and its internal circuitry is not illustrated and explained in detail. Alternative embodiments may use another type of flip-flop, for example, a D flip-flop having a synchronous reset, a toggle (T) flip-flop, a JK flip-flop, an SR flip-flop, or a falling edge-triggered flip-flop.

The D flip-flop 317 has a power terminal PWR that is coupled to a direct current (DC) power source $V_{DD}$. The power source $V_{DD}$ provides power to the flip-flop 317. The D flip-flop 317 has a ground terminal G. The D flip-flop 317 has a data input terminal D that receives a data signal and a clock input terminal C that receives a CLOCK signal. The D flip-flop 317 further includes an output terminal Q. The D flip-flop 317 has an asynchronous set input terminal S and an asynchronous reset input terminal R that are respectively used to asynchronously set and reset the D flip-flop 317.

The portion 312 includes a three-terminal n-channel metal-oxide semiconductor (NMOS) field-effect transistor (FET) 322. The NMOS FET 322 has a drain terminal 323, a source terminal 327, and a gate terminal 328 that is a control terminal. The drain terminal 323 is coupled to the ground terminal G of the flip-flop 317. The source terminal 327 is coupled to a ground 332.

The portion 312 further includes an AND gate 333. The AND gate 333 has input terminals 337 and 338 and an output terminal 342. The output terminal 342 is coupled to the reset terminal R of the D flip-flop 317. Moreover, the portion 312 includes another AND gate 343 that has input terminals 347 and 348 and an output terminal 352. The output terminal 352 is coupled to the set terminal S of the D flip-flop 317.

Moving to the portion 313, the portion 313 has a section 353. The section 353 is coupled to the power source $V_{DD}$ and the ground 332. The section 353 has a memory device such as, e.g., latch 358. The latch 358 has an inverter 362. The inverter 362 has an input terminal 363 and an output terminal 367. The latch 358 also includes a further inverter 368. The inverter 368 has an input terminal 372 and an output terminal 373. The output terminal 367 of the inverter 362 is coupled to the input terminal 372 of the inverter 368. Moreover, the output terminal 367 of the inverter 362 is coupled to the input terminal 338 of the AND gate 333. The output terminal 373 of the inverter 368 is coupled to the input terminal 363 of the inverter 362. Moreover, the output terminal 373 of the inverter 368 is coupled to the input terminal 347 of the AND gate 343.

The section 353 further includes a transmission gate 376. The transmission gate 376 has a three-terminal p-channel metal-oxide semiconductor (PMOS) FET 377. The FET 377 has a source terminal 378, a drain terminal 382, and a gate terminal 383 that is a control terminal. The transmission gate 376 further includes a three-terminal NMOS FET 387. The FET 387 has a drain terminal 388, a source terminal 392, and a gate terminal 393 that is a control terminal. The source terminal 378 and the drain terminal 388 are coupled together to form an end 397 of the transmission gate 376. The end 397 is coupled to the output terminal Q of the D flip-flop 317. The drain terminal 382 and the source terminal 392 are coupled together to form an end 398 of the transmission gate 376. The end 398 is coupled to the input terminal 363 of the inverter 362.

In addition, the portion 313 has a section that is control logic 402. The control logic 402 has a LOW POWER MODE input terminal 407 that receives a LOW POWER MODE input signal. The control logic 402 has a POWER output terminal 408 that is coupled to the gate terminal 328 of the FET 322. A POWER output signal appears at the POWER output terminal 408. Moreover, the control logic 402 has an active low GATE-output terminal 412 that is coupled to the gate terminal 383 of the transmission gate 376. A GATE-output signal appears at the GATE-output terminal 412. The control logic 402 further includes a GATE output terminal 413 that is coupled to the gate terminal 393 of the transmission gate 376. A GATE output signal appears at the GATE output terminal 413. The GATE-output signal is always the inverse of the GATE output signal. The control logic 402 has a LOAD output terminal 417 that is coupled to the input terminals 337 and 348 of the AND gates 333 and 343. In addition, the control logic 402 has a CLOCK input terminal 418 that receives the CLOCK signal.

In the embodiment of FIG. 3, the transmission gate 376 has a PMOS FET 377 and an NMOS FET 387. However, in alternative embodiments, the transmission gate 376 may be implemented with other circuit elements. Moreover, in the embodiment of FIG. 3, the latch 358 has two inverters 362 and 368 that are coupled together. But in alternative embodiments, the latch 358 may be another structure, or a memory device. In addition, in the embodiment of FIG. 3, the state of the output terminal Q is restored through the AND gates 333 and 343. However, in alternative embodiments, other circuit elements could be used in place of the AND gates.

Referring to FIG. 3, the portion 312 has a normal operational mode and a low power operational mode. In the normal operational mode, the FET 322 is turned on and conducts, and current flows through the D flip-flop 317 and the FET 322. In the low power operational mode, the FET 322 is turned off and does not conduct, thereby depriving the D flip-flop 317 of power. During the normal operational mode, when the FET 322 is on, the D flip-flop 317 maintains a logical value that appears at the output terminal Q. This logical value can vary dynamically, during the normal operational mode, as a function of the signals appearing at the data input terminal D and the clock input terminal C. But when the FET 322 is turned off and the D flip-flop 317 is deprived of power, the D flip-flop 317 will lose the logical value that it was maintaining. Therefore, that logical value is saved in the latch 358 while the D flip-flop 317 is turned off, and then after power is restored to the D flip-flop 317, the logical value is transferred from the latch 358 back to the D flip-flop 317.

In more detail, during the normal operational mode of the portion 312, when the FET 322 is on and supplies power to the D flip-flop 317, the transmission gate 376 is conducting, and the logical value from the output terminal Q of the D flip-flop 317 propagates through the transmission gate 376 to the latch 358. Thus, in the normal operational mode, the latch 358 will always contain a logical value that is the same logical value currently appearing at the output terminal Q of the D flip-flop 317. Just before the FET 322 is turned off to deprive the D flip-flop 317 of power, the transmission gate 376 is turned off in order to electrically isolate the latch 358 from the output terminal Q of the D flip-flop 317. The FET 322 is then turned off to remove power from the D flip-flop 317. As a result, the D flip-flop 317 will lose the logical value that it was maintaining. However, this logical value will be preserved in the latch 358, which is still receiving power.

In due course, the FET 322 will be turned on again in order to restore power to the D flip-flop 317, thereby returning the portion 312 to the normal operational mode. As soon as the D flip-flop 317 has power again, the AND gates 333 and 343 are each briefly enabled, and the logical value saved in the latch 358 will enable one of the AND gates 333 and 334 (depending on its logical state) and activate either the asynchronous set input terminal S or the asynchronous reset input terminal R of the D flip-flop 317. As a result, the D flip-flop 317 will be set or reset, as appropriate, thereby restoring to the D flip-flop the logical value that was saved in the latch. The gates 333 and 343 are then disabled, and the transmission gate 376 is again enabled. This returns the circuit of 310 to the same state that it had just before the FET 322 was turned off.

Figure 4:
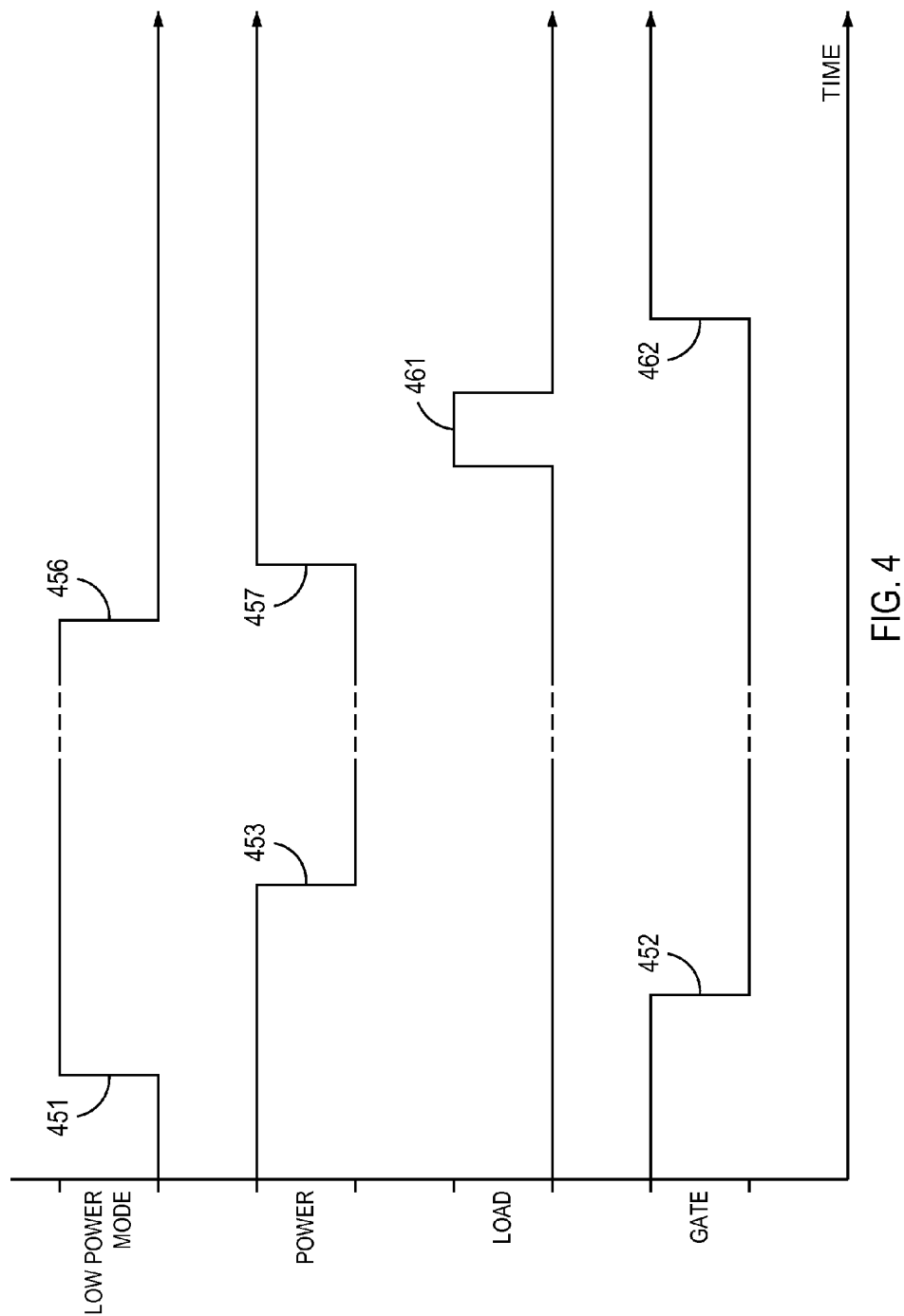
FIG. 4 is a timing diagram showing each of the output signals produced by some control logic in the circuit of FIG. 3.

FIG. 4 is a timing diagram showing each of the output signals produced by the control logic 402, other than the GATE-output signal. Since the GATE-output signal is always the logical complement of the GATE output signal, only the GATE output signal is shown. The left side of the timing diagram shows the states of the control signals when the portion 312 enters the low power operational mode. The right side of the timing diagram shows the states of the control signals when the portion 312 switches back to the normal operational mode.

First refer to the left side of the timing diagram. In the normal operational mode the LOW POWER MODE input signal remains low, the POWER output signal remains high so that power is supplied to the D flip-flop 317, the LOAD output signal remains low to disable both AND gates 333 and 343 (and thereby inhibit setting or resetting of the output terminal Q), and the GATE output signal remains high so that the transmission gate 376 is enabled and the logical value at the output terminal Q passes through the transmission gate 376 to the latch 358.

The portion 312 transitions to the low power operational mode when the LOW POWER MODE input signal goes from low to high at 451. First, the control logic 402 changes the GATE output signal from high to low at 452. This causes the transmission gate 376 to open so that the value in the latch 358 is electrically isolated from the output terminal Q of the D flip-flop 317. Then, the control logic 402 causes the POWER output signal to change from high to low at 453. This causes the FET 322 to turn off, thereby depriving the D flip-flop 317 of power. Now the portion 312 is in the low power operational mode, and the POWER, LOAD, and GATE output signals remain low while the LOW POWER MODE input signal remains high.

Now refer to the right side of the timing diagram. When the LOW POWER MODE input signal received at the LOW POWER MODE input terminal 407 turns low at 456, the control logic 402 sequences the output signals so that the portion 312 switches back to the normal operation mode. First, the control logic 402 causes the POWER output signal to change from low to high at 457. As a result, the FET 322 is turned on and conducts, thereby supplying power to the D flip-flop 317.

After power to the D flip-flop 317 is restored, the control logic 402 changes the LOAD output signal from low to high for a brief duration and then from high back to low, so that there is a pulse 461 in the LOAD output signal. The LOAD pulse 461 briefly enables the AND gates 333 and 343, so that the logical value stored in the latch 358 will enable one of the AND gates 333 and 343. The signals received from the latch 358 at the input terminals 338 and 347 of the AND gates 333 and 343 are always logical complements of one another. One AND gate will receive a logic high and be enabled, and the other will receive a logic low and be disabled. Therefore, during the LOAD pulse 461, only one of the output terminals 342 and 352 of the AND gates 333 and 343 will exhibit a logical high, while the other of the output terminals 342 and 352 will exhibit a logical low. As a result, the D flip-flop 317 will either be asynchronously reset or asynchronously set, depending on which one of the output terminals 342 and 352 exhibits a logical high.

For example, when the logical value stored in the latch 358 is a "0," the output of the inverter 368 is a "0" and the output of the inverter 362 is a "1." The "0" propagates to the input terminal 347 of the AND gate 343 and the "1" propagates to the input terminal 338 of the AND gate 333. During the LOAD pulse 461, a "1" appears at the output terminal 342 of the AND gate 333 and a "0" appears at the output terminal 352 of the AND gate 343. This causes the asynchronous reset input terminal R to receive a "1" and the asynchronous set input terminal S to receive a "0," thereby resetting the D flip-flop 317 so that a "0" appears at the output terminal Q. Consequently, the logical value "0" that was stored in the latch 358 has been restored to the output terminal Q of the D flip-flop 317.

After the state of the logical value is restored from the latch 358 to the output terminal Q, the control logic 402 changes the GATE output signal from low to high at 462, so that the transmission gate 376 becomes conductive, thereby allowing the logical value at the output terminal Q to pass through the transmission gate 376 and into the latch 358. This way, the latch 358 will contain a logical value that is the same logical value that appears at the output terminal Q. Now the portion 312 is back in the normal operational mode.

In alternative embodiments, the timing diagram illustrated in FIG. 4 may vary while adhering to the exemplary operation of the circuit 310. As one example, the GATE output signal does not need to be high before the LOW POWER MODE signal is asserted at 451. Instead, the GATE output signal may exhibit a brief pulse that has a rising edge after 451 and a falling edge at 452.

As any person of ordinary skill in the art of integrated circuits will recognize from the description, figures, and examples that modifications and changes can be made to the embodiments of the invention without departing from the scope of the invention defined by the following claims.

What is claimed is:

1. An apparatus comprising a circuit that includes:
   a first portion having first and second operational modes, the first portion including a flip-flop and consuming less power in the second operational mode than in the first operational mode, the flip-flop containing during the first operational mode a logical value that can vary dynamically; and
   a second portion that is separate from and coupled to the first portion and that includes a latch, wherein during the second operational mode of the first portion, the second portion maintains in the latch the state that the logical value had at a point in time just before the first portion entered the second operational mode, and wherein the second portion restores the state of the logical value from the latch to the flip-flop after the first portion switches from the second operational mode back to the first operational mode.

2. An apparatus according to claim 1,
   wherein the flip-flop includes a first terminal; wherein the latch includes a second terminal;
   wherein the second portion includes a first section having a third terminal coupled to the first terminal, a fourth terminal coupled to the second terminal, and a fifth terminal, the first section selectively electrically coupling and decoupling the third and fourth terminals as a function of an electrical signal at the fifth terminal; and
   wherein the second portion includes a second section having a sixth terminal coupled to the fifth terminal, the second section controlling the first section in a manner so that the third and the fourth terminals are electrically coupled during at least a portion of the first operational mode and electrically decoupled during the second operational mode.

3. An apparatus according to claim 2,
   wherein the first portion includes a third section having a seventh terminal, the flip-flop and the third section being coupled in series together between a power source and ground; and
   wherein the second section includes an eighth terminal coupled to the seventh terminal, the second section controlling the third section in a manner so that a flow of electric power to the flip-flop during the second operational mode is less than a flow of electric power to the flip-flop during the first operational mode.

4. An apparatus according to claim 3, wherein the first section includes a transmission gate having a first end coupled to the third terminal, a second end coupled to the fourth terminal, and a control terminal coupled to the fifth terminal.

5. An apparatus according to claim 4, wherein the third section includes a transistor having a ninth terminal coupled to one of the power source and ground, a tenth terminal coupled to the flip-flop, and a control terminal coupled to the seventh terminal.

6. An apparatus according to claim 5,
wherein the flip-flop includes an eleventh terminal that is one of a set terminal and a reset terminal;
wherein the logical value appears at the first terminal; and
wherein the latch includes a first inverter and a second inverter, each having an input terminal and an output terminal, the output terminal of the first inverter being coupled to the input terminal of the second inverter, the output terminal of the second inverter being coupled to the input terminal of the first inverter and to the second terminal, and the output terminal of one of the first and second inverters being coupled to the eleventh terminal.

7. An apparatus according to claim 1,
wherein the first portion includes a first section, the flip-flop and the first section being coupled in series together between a power source and ground; and
wherein the second portion includes a second section, the second section controlling the first section in a manner so that a flow of electric power to the flip-flop during the second operational mode is less than a flow of electric power to the flip-flop during the first operational mode.

8. An apparatus according to claim 7, wherein the first section includes a transistor having a first terminal coupled to one of the power source and ground, a second terminal coupled to the other of the power source and ground, and a control terminal coupled to the second section.

9. An apparatus according to claim 1, including programmable circuitry, the circuit being included in the programmable circuitry.

10. An apparatus according to claim 1, wherein the flip-flop includes an output terminal, and wherein the logical value appears at the output terminal.

11. An apparatus according to claim 1, wherein the flip-flop is a D flip-flop.

12. A method of operating a circuit having separate first and second portions, the first portion including a flip-flop and the second portion including a latch, the method comprising:
selectively operating the first portion in first and second operational modes, the first portion consuming less power in the second operational mode than in the first operational mode;
maintaining in the flip-flop during the first operational mode a logical value that can vary dynamically;
maintaining in the latch during the second operational mode of the first portion the state that the logical value had at a point in time just before the first portion entered the second operational mode; and
restoring the state of the logical value from the latch to the flip-flop after the first portion switches from the second operational mode back to the first operational mode.

13. A method according to claim 12,
wherein the second portion includes a section coupled between the flip-flop and the latch; and
including controlling the section in a manner so that during at least a portion of the first operational mode the logical value propagates from the flip-flop through the section to the latch, and during the second operational mode the section inhibits propagation of electrical signals therethrough.

14. A method according to claim 13,
wherein the first portion includes a further section, the further section and the flip-flop being coupled in series between a power source and ground; and
wherein the selectively operating includes controlling the further section in a manner so that a flow of power through the further section and the flip-flop during the second operational mode is less than a flow of power through the further section and the flip-flop during the first operational mode.

15. A method according to claim 14,
wherein the further section includes a transistor, the transistor and the flip-flop being coupled in series between the power source and ground; and
wherein the selectively operating includes controlling the transistor in a manner so that a flow of power through the transistor and the flip-flop during the second operational mode is less than a flow of power through the transistor and the flip-flop during the first operational mode.

16. A method according to claim 14,
wherein the section of the second portion includes a transmission gate coupled between the flip-flop and the latch; and
including controlling the transmission gate in a manner so that during at least a portion of the first operational mode the logical value propagates from the flip-flop through the transmission gate to the latch, and during the second operational mode the transmission gate inhibits propagation of electrical signals therethrough.

17. A circuit, comprising:
a first memory device that has first and second power modes and that consumes less power in the second power mode than in the first power mode, the first memory device stores a state of a logical value during the first power mode; and
a second memory device, coupled to the first memory device, wherein the second memory device maintains the state that the logical value had at a point in time just before the first memory device entered the second power mode, and wherein the second memory device transfers the state of the logical value from the second memory device to the first memory device after the first memory device switches from the second power mode back to the first power mode.

18. A circuit according to claim 17, further comprising a transmission gate, coupled to the first memory device and the second memory device, wherein the transmission gate allows propagation of electrical signals during the first power mode but inhibits propagation of the electrical signals during the second power mode.

19. A circuit according to claim 17, further comprising a transistor, coupled to the first memory device, wherein the transistor deprives power to the first memory device when the first memory device is in the second power mode.

20. A circuit according to claim 17, further comprising an AND gate, coupled to the first memory device and the second memory device, wherein the AND gate sets or resets the first memory device depending on the state of the logical value stored in the second memory device.

* * * * *